PROTECTION MEANS FOR SURFACE SEMICONDUCTOR DEVICES
HAVING THIN OXIDE FILMS THEREIN

Filed March 7, 1968

Inventor:
Dale M. Brown,
by John F. Ahern
His Attorney.

United States Patent Office 3,462,657

Patented Aug. 19, 1969

3,462,657

PROTECTION MEANS FOR SURFACE SEMICONDUCTOR DEVICES HAVING THIN OXIDE FILMS THEREIN

Dale M. Brown, Schenectady, N.Y., assignor to General Electric Company, a corporation of New York Filed Mar. 7, 1968, Ser. No. 711,345

Int. Cl. H01l *15/00, 11/00, 13/00*

U.S. Cl. 317—235 5 Claims

ABSTRACT OF THE DISCLOSURE

Protection against failure of an insulating oxide film on a semiconductor body such as the gate oxide in a silicon field effect transistor, wherein a voltage supplied between an electrical conductor overlying the oxide film and a semiconductor body which it covers, is provided by placing a discrete quantity of silicon nitride in electric parallel with the insulating oxide. Silicon nitride has a much higher leakage current before breakdown than insulating oxides as, for example, silicon dioxide.

The present invention relates to semiconductor devices and integrated circuits including such devices. More particularly, the invention is directed to such devices and circuits wherein protective means are provided for thin insulating oxide films to prevent destructive breakdown thereof.

In integrated circuit modules and semiconductor devices included therein or constructed as separate enteties wherein surface phenomenon are important and wherein electrodes are separated from the main body of the semiconductor substrate by a thin, high purity insulating dielectric, generally an oxide, as for example, silicon dioxide in silicon semiconductor devices and integrated circuits, there is a problem in protecting such protective oxide films against destructive breakdown, due to high voltage transients or the exceeding of the safe limits of field strength therethrough.

In the prior art, various attempts have been made to provide such protection by providing Zener diodes or avalanche diodes in electric circuit parallel with such insulating films in the regions wherein electrical stress is present, so that such diodes will break down at a lower voltage than the surface oxide would normally break down and prevent the destruction of the surface oxides. Although electrically, such expedients are satisfactory, as a practical matter, it is exceedingly difficult, expensive and cumbersome to utilize such added circuit protective devices.

Accordingly, an object of the present invention is to provide protection for insulating dielectric films in surface effect semiconductor devices and circuits in the simplest manner possible.

Another object of the invention is to provide self-contained insulating protective means for semiconductor surface effect devices and circuits.

Still another object of the present invention is to provide semiconductor devices and circuit modules having improved surface oxide protective means.

Yet another object of the present invention is to provide highly reliable and inexpensive surface effect semiconductor devices and circuitry having therein self-contained protective means to avoid the destructive breakdown of surface oxide insulators.

Briefly stated, in accord with the present invention, I provide, in semiconductor devices utilizing thin passivating dielectrics, such as oxides, having incorporated therein self-contained regions comprising silicon nitride in electrical circuit parallel with the passivating dielectric oxides, to provide overload protection for such oxides from a voltage applied between an electrode positioned thereover and the main body of the semiconductor device or circuit.

Figure 1:
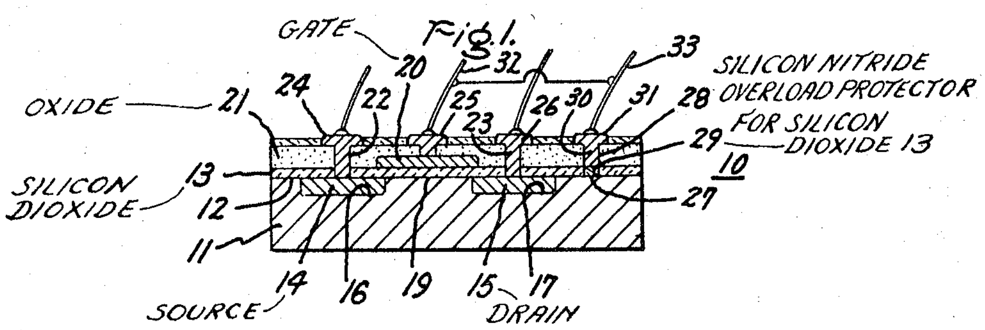
Figure 2:
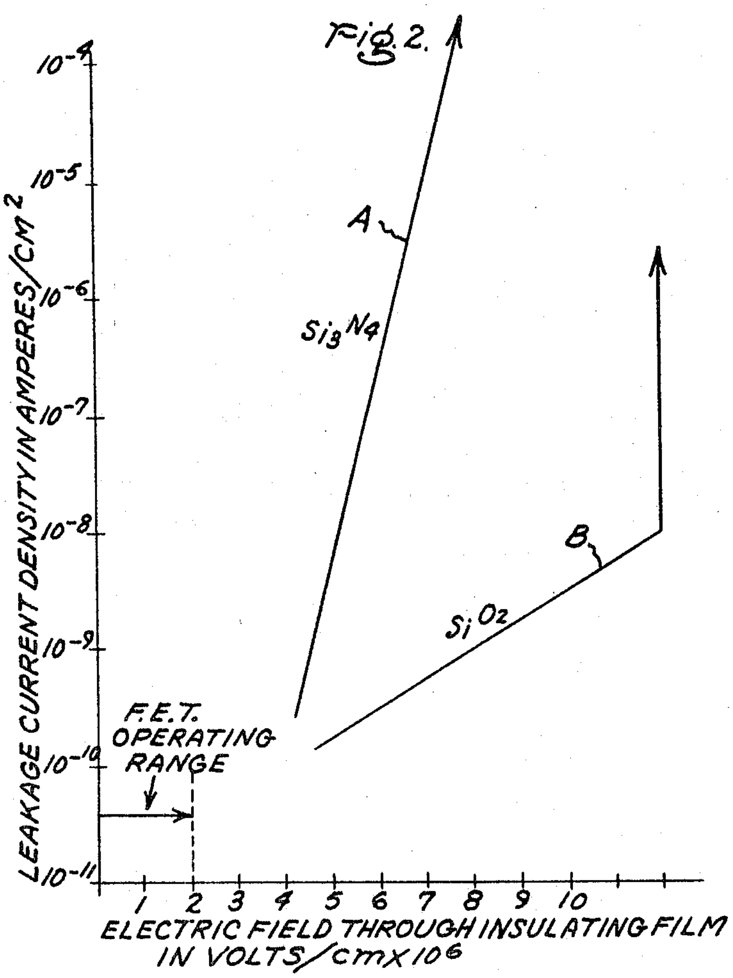

The novel features believed characteristic of the present invention are set forth in the appended claims. The invention itself, together with further objects and advantages thereof, may best be understood by reference to the following detailed description, taken in connection with the appended drawing in which:

FIGURE 1 is a schematic vertical cross-sectional view of a field effect transistor constructed in accord with the present invention and including oxide protective means therefor, FIGURE 2 is a graph illustrating the current leakage versus applied field for silicon dioxide and silicon nitride films of equivalent thickness.

FIGURE 1 of the drawing illustrates an oxide passivated enhancement mode field effect transistor including oxide protective means in accord with the present invention. The device of FIGURE 1 may conveniently be an N-channel device 10 fabricated on a P-type silicon wafer 11, for example, having a suitable quantity of boron activator, for example, having therein as to cause P-type conductivity characteristics of, for example, 1 ohm cm. An active surface 12 of wafer 11 is coated with a thin insulating, high-purity oxide, as for example, thermally grown silicon dioxide, which is not pierced or apertured during the fabrication of the device until it is necessary to do so in order to make electrical contact to the source and drain regions thereof. Source and drain regions 14 and 15 are discrete, surface-adjacent N-type conductivity regions having a sufficient quantity of a donor, as for example phosphorous, diffused therein through oxide film 13 as to cause the appropriate and desired conductivity characteristics therefor as, for example, a resistivity of 0.001 ohm cm. Source and drain regions 14 and 15 define P-N junctions 16 and 17, respectively, with the main portion of the semiconductor wafer 11, which junctions intersect surface 12 of water 11 to form regular geometric patterns. The portion of the surface 12 between these patterns constitutes a surface channel 19. Conduction of electrons from source 14 to drain 15 through channel 19 is governed by the potential applied to gate 20 which overlies oxide film 13 at the region over channel 19 and overlaps the intersection of junction 16 and 17 with surface 12, so as to form a registered device, particularly advantageous in enhancement-mode devices.

A source electrode 22 and a drain electrode 23 are formed by etching holes in a second, pyrolytically deposited protective oxide film 21 and gate oxide film 13 and evaporating a conductive metal as, for example aluminum, therein to fill the holes and cause the deposition of aluminum over the surface of the entire wafer. The wafer is masked and the excess aluminum is removed, leaving slightly laterally enlarged electrode contact members 24, for the source, 25 for the gate, and 26 for the drain.

Construction of devices as set forth generally above, and illustrated schematically in FIGURE 1, is set forth in greater detail in the copending application of Brown, Engeler, Garfinkel and Gray S.N. 675,228, filed Oct. 13, 1967, and assigned to the present assignee, the entire disclosure of which is incorporated herein by reference thereto. While the device illustrated herein is an N-channel field effect transistor it could equally as well be a P-channel device. To accomplish this, it is only necessary that the dopants be reversed in order.

In the absence of other means, the destructive breakdown of the field effect transistor 10 of FIGURE 1 may occur if a voltage is applied between gate 20 and the main region of wafer 11 of the semiconductor wafer, by the application of an overload transient thereto, for example. Similarly, when electrical contact, in integrated circuit fashion is made to either of source or drain electrodes 24 and 26, for example, and such electrical contact lead is overlaid on the surface of insulator 21 and applies an electric field across passivating oxide 13, it is possible that the electric field through film 13 may be such as to exceed the breakdown potential thereof. Should such occur, a destructive breakdown thereof occurs and the oxide no longer functions as an insulator to protect the surface of wafer 11 and the device must be discarded. In accord with the present invention, I provide a safety means to prevent such destruction.

Referring again again to FIGURE 1, a discrete region of oxide film 13 is removed at a region closely adjacent, but not within the active portion of field effect transistor 10, as for example, at 27 and a thin film portion of silicon nitride, of substantially the same thickness as oxide layer 10, is formed therein. Since the thickness of silicon dioxide layer 13 may conveniently be of the order of one thousand A.U., a similar thickness of silicon nitride may be formed thereat, for example, after the formation of the active regions of the device but prior to the connection of the electrodes thereto. This may, for example, be done by suspending the oxide coated wafer having an aperture 28 in the oxide film at 27, in a reaction chamber, heating the wafer to approximately 1000° C. and causing a mixture of a silane and ammonia gas to pass thereover at a flow rate of approximately 50 cubic feet per hour for approximately 5 minutes to cause the pyrolytic deposition of a 1000 A.U. layer thick film 29 of silicon nitride ($Si_3N_4$) over the entire wafer including the exposed surface of silicon wafer 11 through the aperture at 27.

After for formation of the silicon nitride region 29, which may, for example, have a lateral dimension of approximately 1 to 10 microns, for example, the wafer 15 is masked and etched with boiling phosphoric acid to expose source and drain regions. Contacts are made thereto in the same fashion as is made to source and drain regions 14 and 15 and gate 20 by evaporation of aluminum into the aperture in film 21 to cause the formation of electrode 30 and contact 31.

Assuming that the greatest stress upon passivating oxide film 13 is to be between gate 20 and semiconductor wafer 11, protection for the gate oxide is provided by connecting electrode leads 32 and 33, to the gate contact member 25 and protective nitride member, respectively. Application of a high voltage between the gate and the semiconductor wafer 11, thus applies the same voltage to protective electrode 30 and impresses the same electric field through the silicon nitride film region 29 as is applied to gate oxide film 13 between gate electrode 20 and wafer 11.

The leakage current characteristics of silicon nitride and silicon dioxide as a function of electric field are illustrated in FIGURE 2 of the drawing. In FIGURE 2, leakage current density in amperes per square centimeters is plotted logarithmically as ordinate and electric field through the insulating film in volts per centimeter times $10^6$ is plotted as abscissa. In the drawing, curve A represents the leakage characteristics of silicon nitride and curve B represents the leakage characteristics of silicon dioxide. As is evident from the curves of FIGURE 2, silicon dioxide exhibits a very low leakage current, which accounts for its ideal characteristic as an insulator up to a given applied voltage. At that voltage, which is sufficient to provide an electric field of approximately $12\times10^6$ volts per centimeter through the insulating film, the silicon dioxide abruptly breaks down and undergoes a destructive rupture, thus making it useless as an insulator for future uses. Silicon nitride, on the other hand, beginning at a field strength of approximately $4\times10^6$ volts per centimeter exhibits substantially the same leakage current as silicon dioxide. With increasing field strength, however, it shows a much more pronounced increase in leakage current, which allows for a gradual conduction of electric current therethrough in a nondestruction manner, thus alowing it to carry current without entering into a destructive and non-reversible change. As is indicated by the drawing FET operating voltages are well below this range, but may rise due to transients.

Accordingly, devices utilizing silicon nitride in parallel with silicon dioxide as a protective measure therefor may be operated at any electric field less than $4\times10^6$ volts per centimeter field without any distortion of the insulating characteristics of the device and yet are protected against voltage transients which can cause increases in field strengths thereover. Thus, the operating range of the applied voltages, and consequently the applied fields to the oxide film, may be maintained within the region at which the silicon nitride does not, by its leakage current distort the insulating current of the oxide and yet, provide breakdown voltage protection for the oxide for any voltage or fields in excess of this value. As a practical matter, the voltages and fields utilized field effect devices such as field effect transistors and surface effect integrated circuit modules lie well within the range of the field strengths less than $4\times10^6$ volts per centimeter, thus allowing for useful operation of such devices without distortion while providing breakdown protection for the oxides.

While the invention has been described herein specifically with respect to field effect transistor protection, the invention concept may be utilized equally well in other surface-passivated devices. Thus, for example, in planar diffused transistor devices wherein emitter and base leads pass over oxide passivated collector regions, or the converse, break down between emitter or base leads and the collector (or the converse) may be avoided by the inclusion of a silicon nitride safety leakage path along the sensitive surface region. Devices of the latter nature, well adapted to be so protected are disclosed in the copending application of Brown and Engeler Ser. No. 675,226, filed Oct. 13, 1967, now abandoned assigned to the present assignee. The entire disclosure thereof is incorporated herein by reference thereto.

Similarly, although the invention has been disclosed herein with respect to the MOS structures to protect the oxide film thereof, it is equally as applicable to the MNOS structure as set forth in Horn application Ser. No. 530,-811, filed Mar. 1, 1966 and assigned to the present assignee, to protect the oxide films thereof.

From the foregoing, it may be seen that I have disclosed improved surface effect and surface-passivated semiconductor devices and integrated circuits having improved oxide protection against destructive breakdown. This is achieved by the inclusion, at the regions susceptible to overload field applied to passivating oxides therein, of a parallel connected discrete region of silicon nitride which serves, by providing a means for the passage of leakage current therethrough, voltage overload protection for the oxide film.

While the invention has been disclosed herein with respect to specific embodiments thereof, many modifications and changes will readily occur to those skilled in the art. Accordingly, by the appended claims, I intend to cover all such modifications and changes as fall within the true spirit and scope of the present invention.

What I claim as new and desire to secure by Letters Patent of the United States is:

1. In semiconductor devices wherein an oxide film upon the surface of a semiconductor body provides insulation between the semiconductor body and a first electrode overlying said oxide film, the improvement which comprises:

(a) an aperture in said oxide film;

(b) a film of silicon nitride deposited within said aperture and upon the surface of said silicon body;

(c) a second conducting contact overlying said silicon nitride film; and (d) means electrically connecting said first and second electrodes and placing said silicon nitride film in electrical parallel with said oxide film so that said silicon nitride film provides breakdown protection for said oxide film.

2. The improvement of claim 1 wherein said semiconductor body is silicon and said oxide is silicon dioxide.

3. The improvement of claim 1 wherein said first electrode is the gate electrode of a field effect transistor and said silicon nitride film prevents breakdown of the gate oxide thereof upon the application of a gate voltage.

4. The improvement of claim 1 where said contact is an electric conductor overlying an insulating oxide on a semiconductor body to connect discrete regions of an integrated circuit module.

5. The improvement of claim 4 wherein said semiconductor body is silicon and said oxide is silicon dioxide.

References Cited

UNITED STATES PATENTS

| | | | |
|---|---|---|---|
| 3,259,759 | 7/1966 | Giaever | 307—88.5 |
| 3,271,201 | 9/1966 | Pomerantz | 148—33.3 |
| 3,373,051 | 3/1968 | Chu et al. | 117—106 |
| 3,379,584 | 4/1968 | Bean et al. | 148—175 |

JOHN W. HUCKERT, Primary Examiner

S. BRODER, Assistant Examiner